United States Patent
Ye

(10) Patent No.: US 10,547,924 B2
(45) Date of Patent: Jan. 28, 2020

(54) MICROPHONE STRUCTURE AND FLIP-TYPE ELECTRONIC DEVICE

(71) Applicants: ZILLTEK TECHNOLOGY (SHANGHAI) CORP.; ZILLTEK TECHNOLOGY CORP., Hsinchu (TW)

(72) Inventor: Jinghua Ye, Shanghai (CN)

(73) Assignees: ZILLTEK TECHNOLOGY (SHANGHAI) CORP., Shanghai (CN); ZILLTEK TECHNOLOGY CORP., Taiwan (CN)

( * ) Notice: Subject to any disclaimer, the term of this patent is extended or adjusted under 35 U.S.C. 154(b) by 0 days.

(21) Appl. No.: 15/880,446

(22) Filed: Jan. 25, 2018

(65) Prior Publication Data
US 2019/0166417 A1 May 30, 2019

(30) Foreign Application Priority Data
Nov. 27, 2017 (CN) .......................... 2017 1 1202824

(51) Int. Cl.
| H04R 1/08 | (2006.01) |
| G06F 1/16 | (2006.01) |
| H01L 23/04 | (2006.01) |
| H04R 1/04 | (2006.01) |

(52) U.S. Cl.
CPC ........... *H04R 1/083* (2013.01); *G06F 1/1684* (2013.01); *H01L 23/04* (2013.01); *H04R 1/04* (2013.01); *H04R 2201/003* (2013.01)

(58) Field of Classification Search
CPC ........ H04R 1/083; G06F 1/1684; H01L 23/04
See application file for complete search history.

(56) References Cited

U.S. PATENT DOCUMENTS

| 8,170,244 | B2 * | 5/2012 | Ryan | ..................... H04R 1/406 381/174 |
| 8,983,107 | B2 * | 3/2015 | Liu | ...................... H04R 19/005 257/419 |
| 2012/0043629 | A1 * | 2/2012 | Minervini | ............. B81B 7/0061 257/416 |
| 2013/0129136 | A1 * | 5/2013 | Harney | .................. H04R 1/342 381/355 |
| 2017/0142524 | A1 * | 5/2017 | Sooriakumar | ........ B81B 7/0061 |
| 2018/0317006 | A1 * | 11/2018 | Heimbigner | ........... H04R 1/326 |

\* cited by examiner

*Primary Examiner* — Tuan D Nguyen
(74) *Attorney, Agent, or Firm* — Andrew F. Young, Esq.; Lackenbach Siegel, LLP

(57) ABSTRACT

The invention discloses a novel microphone structure and a flip-type electronic device, comprising: a first layer plate, an acoustic sensor and a circuit chip being connected to the first layer plate; a second layer plate, covered on the first layer plate; wherein, the first layer plate and second layer plate form a microphone acoustic cavity, and the microphone acoustic cavity is provided with two acoustic through-holes located at two opposite sides or two adjacent sides of the microphone acoustic cavity. The beneficial effects of the technical schemes of the invention include: two acoustic through-holes are provided on the microphone acoustic cavity of the novel microphone structure, and the two acoustic through-holes are disposed on two opposing sides or two adjacent sides of the microphone acoustic cavity, such that sound received from inside corresponds to that received from outside when using the flip-type electronic device.

4 Claims, 3 Drawing Sheets

MICROPHONE STRUCTURE AND FLIP-TYPE ELECTRONIC DEVICE

CROSS-REFERENCE TO RELATED APPLICATIONS

The present application claims priority to and the benefit of Chinese Patent Application No. CN 201711202824.7, filed on Nov. 27, 2017, the entire content of which is incorporated herein by reference.

BACKGROUND OF THE INVENTION

1. Field of the Invention

The invention relates to the field of micro-electromechanical technology, and more particularly, to a novel microphone structure and a flip-type electronic device.

2. Description of the Related Art

With the development of mobile multimedia technology, electronic products tend to become miniature and integrated. Among the electronic products in the electroacoustic field, microphone is used to convert an acoustic signal into an electrical signal.

Now, laptops' functions have become more diversified, and some of them have functions of voice input, application of voice communication over network and voice recording, that is, the laptop has application configured for receiving sound. A traditional laptop panel is provided with sound holes, and the opening of the sound hole is arranged in the direction of a computer screen. In doing so, the sound holes are covered when the laptop is closed, thus, the sound hole cannot acquire sound effectively, causing inconvenience to a user.

SUMMARY OF THE INVENTION

Given that the foregoing problems exist in the prior art, the present invention provides a novel microphone structure and a flip-type electronic device intended to receive sound from inside and outside.

Detailed technical schemes are as follows:

A novel microphone structure, comprising:

a first layer plate, an acoustic sensor and a circuit chip being connected to the first layer plate;

a second layer plate, covering the first layer plate;

wherein, the first layer plate and second layer plate form a microphone acoustic cavity, and the microphone acoustic cavity is provided with two acoustic through-holes located at two opposite sides or two adjacent sides of the microphone acoustic cavity.

Preferably, wherein a first acoustic through-hole is provided on the first layer plate, and a second acoustic through-hole is provided on a first side of the second layer plate, and the first acoustic through-hole and the second acoustic through-hole are disposed on the two opposing sides of the microphone acoustic cavity, respectively.

Preferably, wherein the first acoustic through-hole and the second acoustic through-hole are aligned with one another.

Preferably, wherein a first acoustic through-hole is provided on the first layer plate, and a second acoustic through-hole is provided on a second side of the second layer plate, and the first acoustic through-hole and the second acoustic through-hole are disposed on the two adjacent sides of the microphone acoustic cavity, respectively.

Preferably, wherein a first acoustic through-hole is provided on a first side of the second layer plate, and a second acoustic through-hole is provided on the second side of the second layer plate, and the first acoustic through-hole and the second acoustic through-hole are disposed on the two adjacent sides of the microphone acoustic cavity, respectively.

Preferably, wherein the first layer plate is a printed circuit board and the bottom of the printed circuit board is provided with a pad.

Preferably, wherein the acoustic sensor is connected to the circuit chip via lead wires.

A flip-type electronic device, comprising a foldable cover plate, wherein the cover plate is provided with at least two through-holes disposed on two opposing sides or two adjacent sides of the cover plate, and any one of the above novel microphone structures is installed in the through-holes.

Preferably, wherein the at least two through-holes are aligned with and penetrating the two acoustic through-holes of the novel microphone structure.

Preferably, wherein the flip-type electronic device is a laptop.

The beneficial effects of the technical schemes of the invention include: two acoustic through-holes are provided on the microphone acoustic cavity of the novel microphone structure, and the two acoustic through-holes are disposed on two opposing sides or two adjacent sides. By changing installation position of the novel microphone structure, sound received from inside corresponds to that received from outside when using the flip-type electronic device, and sound can be received from outside even when the cover of the flip-type electronic device is closed.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
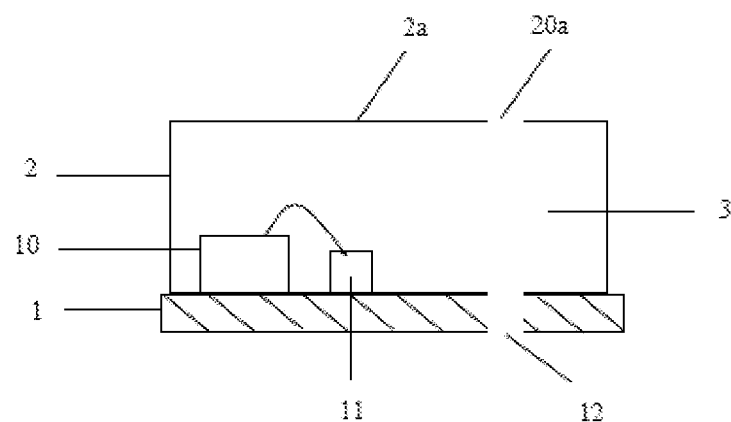
FIG. 1 is a structure diagram of an embodiment 1 of a novel microphone structure according to the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

The present invention comprises a novel microphone structure, comprising:

a first layer plate 1, an acoustic sensor 10 and a circuit chip 11 being connected to the first layer plate 1;

a second layer plate 2, covering the first layer plate 1;

wherein, the first layer plate 1 and second layer plate 2 form a microphone acoustic cavity 3, and the microphone acoustic cavity 3 is provided with two acoustic through-holes located at two opposite sides or two adjacent sides of the microphone acoustic cavity 3.

In the above novel microphone structure, as shown in FIG. 1, firstly, the acoustic sensor 10 is used to convert an acoustic signal into a voltage signal, and the circuit chip 11 performs signal processing and analog-to-digital conversion to the output voltage signal, and finally a digital signal is acquired; moreover, the first layer plate 1 and second layer plate 2 form a microphone acoustic cavity 3, and the microphone acoustic cavity 3 is provided with two acoustic through-holes located at two opposite sides or two adjacent sides of the microphone acoustic cavity 3, and the novel microphone structure is suitable for all types of flip-type electronic devices by changing installation position of the novel microphone structure, such that the interior of the microphone acoustic cavity 3 is communicating with the outside world, whereby voice signal is transmitted to the outside world.

In a preferred embodiment, a first acoustic through-hole 12 is provided on the first layer plate 1, and a second acoustic through-hole 20a is provided on a first side 2a of the second layer plate 2, and the first acoustic through-hole 12 and the second acoustic through-hole 20a are disposed on the two opposing sides of the microphone acoustic cavity 3, respectively.

In a preferred embodiment, the first acoustic through-hole 12 and the second acoustic through-hole 20a are aligned with one another.

Specifically, in the embodiment 1, as shown in FIG. 1, a first acoustic through-hole 12 is provided on the first layer plate 1, and a second acoustic through-hole 20a is provided on the first side 2a of the second layer plate 2, and the first acoustic through-hole 12 and the second acoustic through-hole 20a are disposed on the two opposing sides of the microphone acoustic cavity 3, respectively, and the first acoustic through-hole 12 and the second acoustic through-hole 20a are aligned, such that sound, received from inside and outside by the first acoustic through-hole 10 and the second acoustic through-hole 20a, keeps the same.

In a preferred embodiment, a first acoustic through-hole 12 is provided on the first layer plate 1, and a second acoustic through-hole 20b is provided on a second side 2b of the second layer plate 2, and the first acoustic through-hole 12 and the second acoustic through-hole 20b are disposed on the two adjacent sides of the microphone acoustic cavity 3, respectively.

Figure 2:
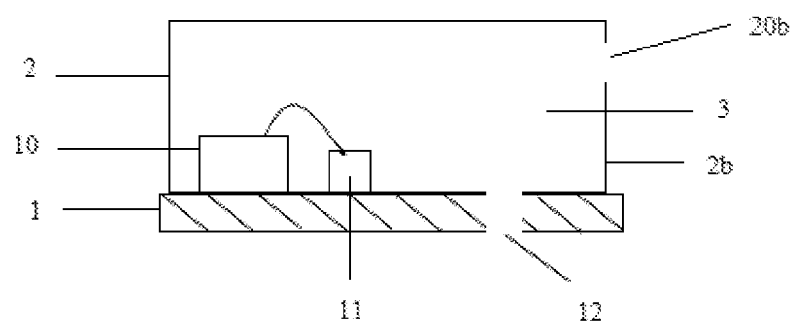
FIG. 2 is a structure diagram of an embodiment 2 of a novel microphone structure according to the present invention.

Specifically, in the embodiment 2, as shown in FIG. 2, a first acoustic through-hole 12 is provided on the first layer plate 1, and a second acoustic through-hole 20b is provided on the second side 2b of the second layer plate 2, and the first acoustic through-hole 12 and the second acoustic through-hole 20b are disposed on the two adjacent sides of the microphone acoustic cavity 3, respectively, whereby this novel microphone structure is suitable for more flip-type electronic devices by changing installation position of the novel microphone structure.

In a preferred embodiment, a first acoustic through-hole 20a is provided on a first side 2a of the second layer plate 2, and a second acoustic through-hole 20b is provided on the second side 2b of the second layer plate 2, and the first acoustic through-hole 20a and the second acoustic through-hole 20b are disposed on the two adjacent sides of the microphone acoustic cavity 3, respectively.

Figure 3:
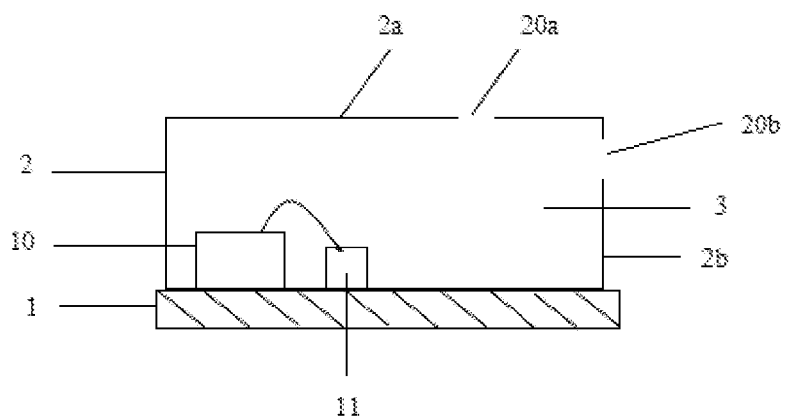
FIG. 3 is a structure diagram of an embodiment 3 of a novel microphone structure according to the present invention.

Specifically, in the embodiment 3, as shown in FIG. 3, a first acoustic through-hole 20a is provided on a first side 2a of the second layer plate 2, and a second acoustic through-hole 20b is provided on the second side 2b of the second layer plate 2, and the first acoustic through-hole 20a and the second acoustic through-hole 20b are disposed on the two adjacent sides of the microphone acoustic cavity 3, respectively, whereby this novel microphone structure is suitable for more flip-type electronic devices by changing installation position of the novel microphone structure.

In a preferred embodiment, the first layer plate 1 is a printed circuit layer plate and the bottom of the printed circuit layer plate is provided with a pad.

In a preferred embodiment, the acoustic sensor 10 is connected to the circuit chip 11 via lead wires. The acoustic sensor 10 and the circuit chip 11 on the first layer plate are connected with the external power supply through the printed circuit layer plate and the lead wires, to form a complete circuit loop for the signal conversion process.

It is noted that the acoustic sensor 10 and the circuit chip 11 are technologies in the art, so details will be omitted herein.

A flip-type electronic device, comprising a foldable cover 4, wherein the cover 4 is provided with at least two through-holes 40 disposed on two opposing sides or two adjacent sides of the cover 4, and any one of the above novel microphone structures is installed in the through-holes 40.

In a preferred embodiment, the at least two through-holes 40 are aligned with and penetrating the two acoustic through-holes of the novel microphone structure, respectively.

In a preferred embodiment, the flip-type electronic device is a laptop.

Figure 4:
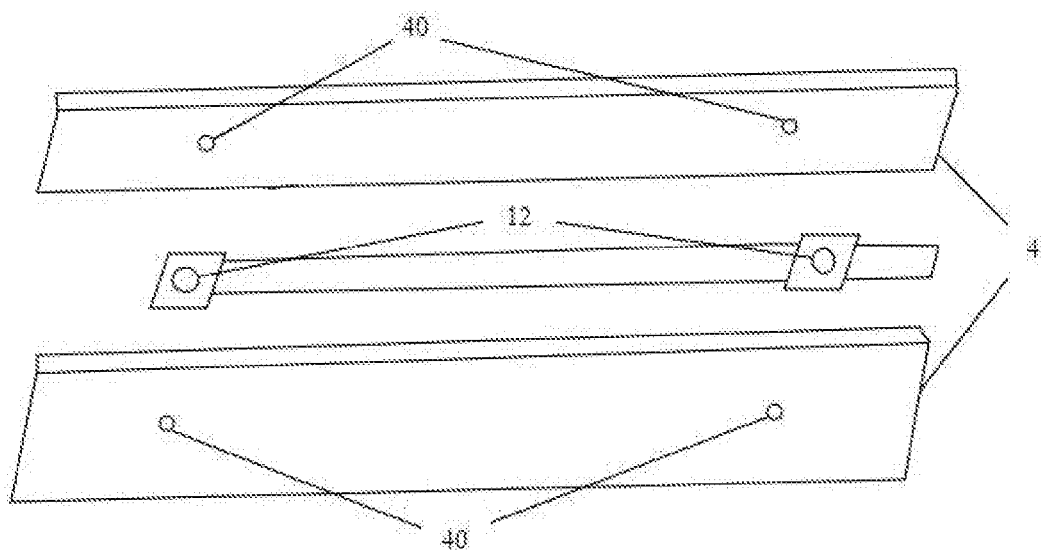
FIG. 4 is a front partial exploded view of a flip-type electronic device in an embodiment of the present invention.
Figure 5:
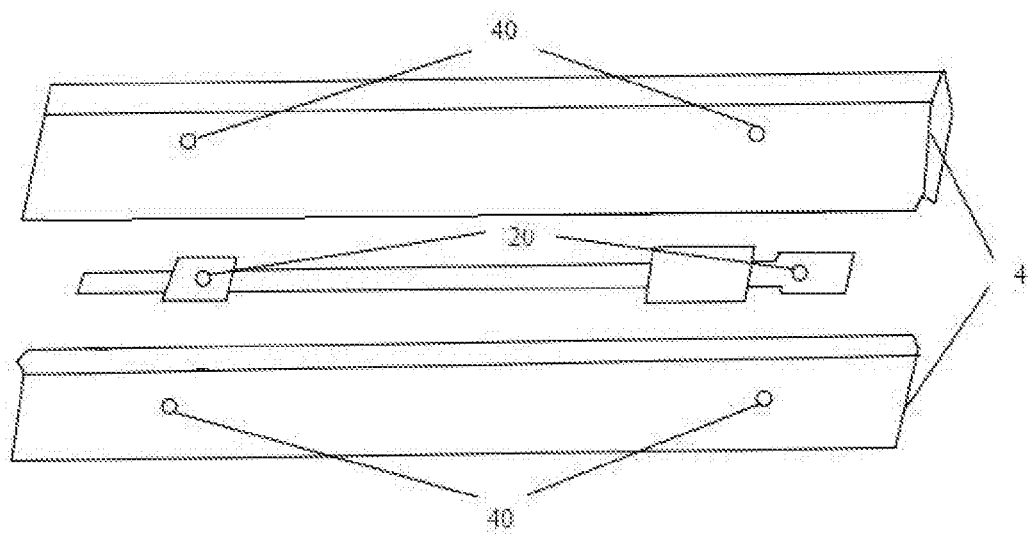
FIG. 5 is a rear partial exploded view of a flip-type electronic device in an embodiment of the present invention.

Specifically, a front partial exploded view of the laptop as shown in FIG. 4, and a reverse partial exploded view of the laptop as shown in FIG. 5;

Further, the user can select the novel microphone structure of embodiment 1 or of embodiment 2 or of embodiment 3, and changing of installation position of the novel microphone structure allows two opposing sides or two adjacent sides of the cover 4 of the flip-type electronic device can receive the same sound, and sound can be received from outside even when the laptop is closed.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A microphone structure, comprising:
    a first layer plate, an acoustic sensor and a circuit chip being connected to the first layer plate, the first layer plate is a printed circuit board and the printed circuit board is provided with a pad at its bottom;
    a second layer plate, covering the first layer plate;
    wherein, only one microphone acoustic cavity, being formed by the first layer plate and the second layer plate, and the microphone acoustic cavity is provided with two acoustic through-holes located at two adjacent sides of the microphone acoustic cavity, when one acoustic through-hole is covered, the other acoustic through-hole receives sound from outside.

2. The microphone structure of claim 1, wherein a first acoustic through-hole is provided on the first layer plate, and a second acoustic through-hole is provided on a second side of the second layer plate, and the first acoustic through-hole and the second acoustic through-hole are disposed on the two adjacent sides of the microphone acoustic cavity, respectively.

3. The microphone structure of claim 1, wherein a first acoustic through-hole is provided on a first side of the second layer plate, and a second acoustic through-hole is provided on the second side of the second layer plate, and the first acoustic through-hole and the second acoustic through-hole are disposed on the two adjacent sides of the microphone acoustic cavity, respectively.

4. The microphone structure of claim 1, wherein the acoustic sensor is connected to the circuit chip via lead wires.

* * * * *